(12) United States Patent
Fischer et al.

(10) Patent No.: US 8,531,008 B2
(45) Date of Patent: Sep. 10, 2013

(54) MATERIAL STRUCTURE IN SCRIBE LINE AND METHOD OF SEPARATING CHIPS

(75) Inventors: Thomas Fischer, Regensburg (DE); Heinz Opolka, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 308 days.

(21) Appl. No.: 12/952,403

(22) Filed: Nov. 23, 2010

(65) Prior Publication Data
US 2012/0126228 A1 May 24, 2012

(51) Int. Cl.
*H01L 23/544* (2006.01)
(52) U.S. Cl.
USPC ............ 257/620; 257/E23.179; 257/E21.599; 438/462
(58) Field of Classification Search
USPC ........... 257/620, E23.179, E21.599; 438/462
See application file for complete search history.

(56) References Cited

U.S. PATENT DOCUMENTS

| | | | | |
|---|---|---|---|---|
| 5,530,280 A | * | 6/1996 | White | 257/508 |
| 6,951,801 B2 | * | 10/2005 | Pozder et al. | 438/462 |
| 2009/0057842 A1 | * | 3/2009 | He et al. | 257/620 |
| 2009/0121321 A1 | * | 5/2009 | Miccoli et al. | 257/618 |
| 2011/0006389 A1 | * | 1/2011 | Bachman et al. | 257/508 |

* cited by examiner

*Primary Examiner* — Trung Q Dang
(74) *Attorney, Agent, or Firm* — Slater & Matsil, L.L.P.

(57) ABSTRACT

A method for manufacturing a chip is disclosed. The method comprises forming a material structure in a kerf adjacent the chip on a wafer. The method further comprises selectively removing the material structure in the kerf and dicing the wafer.

A semiconductor wafer is disclosed. The semiconductor wafer comprises a plurality of chips and a plurality of kerfs. The kerfs separate the chips from each other. At least one kerf comprises a kerf framing. The kerf framing is arranged directly adjacent a side of the at least on chip.

21 Claims, 5 Drawing Sheets

MATERIAL STRUCTURE IN SCRIBE LINE AND METHOD OF SEPARATING CHIPS

TECHNICAL FIELD

The present invention relates generally to semiconductor devices and to the manufacture of semiconductor devices, and more particularly to kerf framing and the manufacture of a kerf framing.

BACKGROUND

Dozens or hundreds of integrated circuits are typically manufactured on a single semiconductor wafer. The semiconductor wafer comprises chips or dies in which the integrated circuits are located, and kerfs or scribe lines which separate the individual chips. The individual chips are diced by sawing the wafer along the kerf. The individual chips are then typically packaged, either separately or in a multi-chip module.

SUMMARY OF THE INVENTION

In one embodiment a method for manufacturing a chip is disclosed. The method comprises forming a material structure in a kerf adjacent the chip on a wafer. The method further comprises selectively removing the material structure in the kerf and dicing the wafer.

In one embodiment a semiconductor wafer is disclosed. The semiconductor wafer comprises a plurality of chips and a plurality of kerfs. The kerfs separate the chips from each other. At least one kerf comprises a kerf framing. The kerf framing is arranged directly adjacent a side of at least one chip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor wafer.

Figure 1:
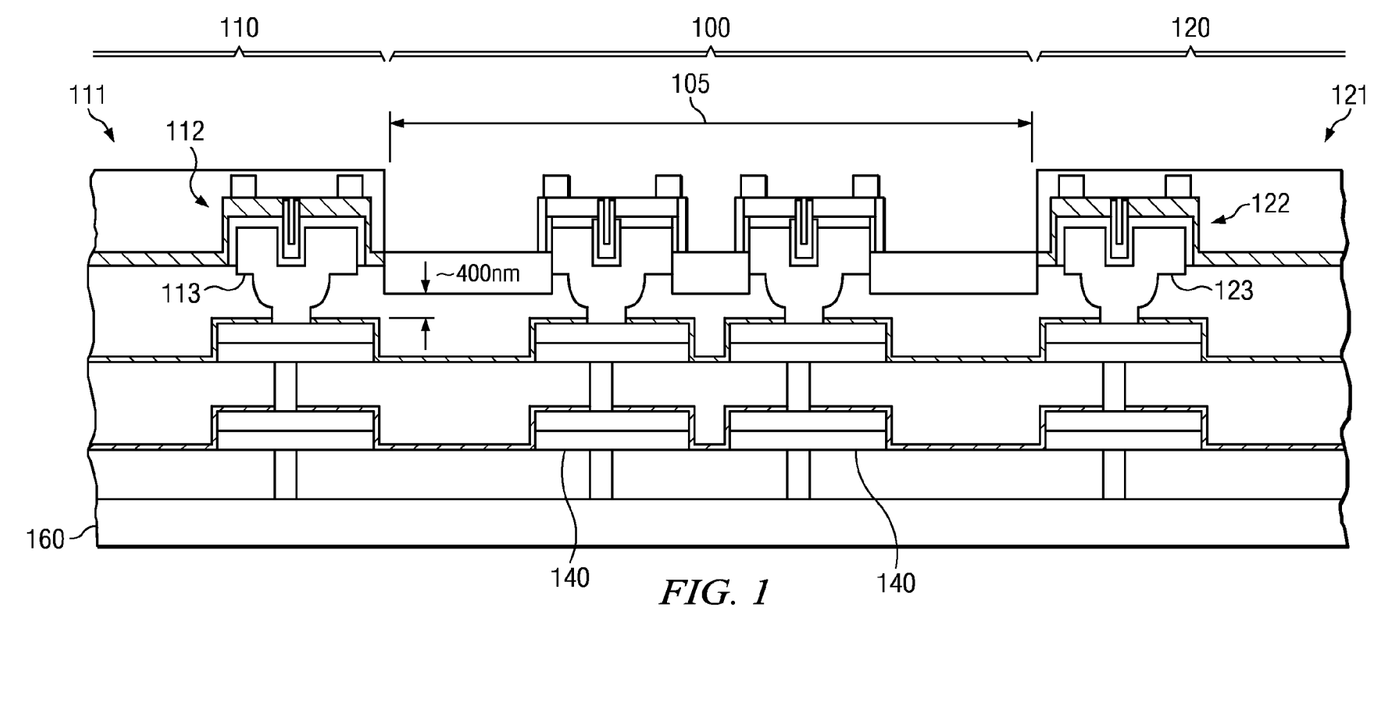
FIG. 1 shows a conventional kerf between two chips.

FIG. 1 shows a conventional arrangement of a kerf 100 between two chips 110, 120. Each chip 110, 120 comprise an inner region 111, 121 and a peripheral region 112, 122. The inner region 111, 121 may comprise an integrated circuit or a single device such as a power transistor. For example, the integrated circuit may be a logic device such as a microcontroller or a memory device such as a DRAM or a non-volatile memory. The inner region 111, 121 may comprise one or several metallization layers. The peripheral region 112, 122 may comprise a crack stop barrier or a seal ring 113, 123 around the chips 110, 120. The crack stop barrier or the seal ring 113, 123 may prevent cracks from propagating into the inner region 111, 121 of the chips 110, 120. The chip 110, 120 may be encapsulated by silicon dioxide or a passivation material.

Figure 2:
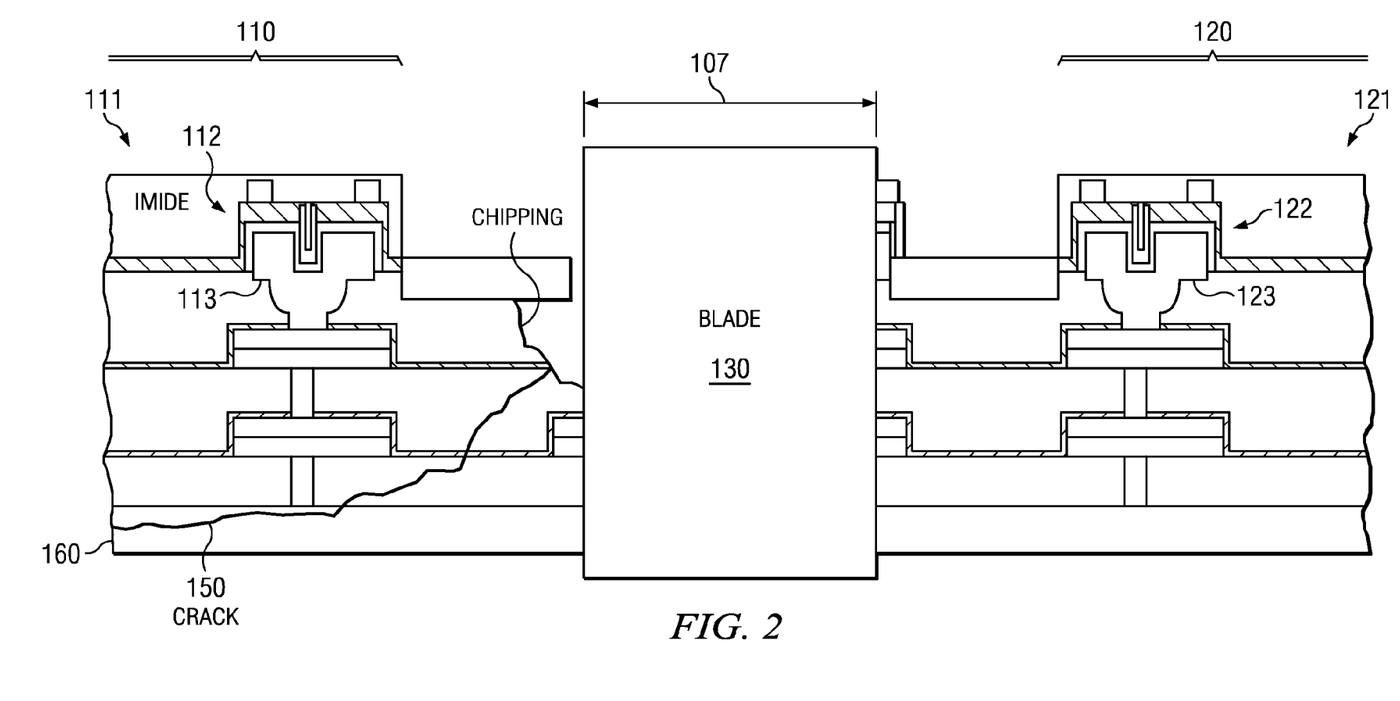
FIG. 2 shows a conventional kerf while a blade is separating the chips.

The kerf 100 is an area between the chips 110, 120. The chips 110, 120 are singulated by cutting the wafer along the kerf 100. The width 105 of the kerf 100 may be wider than the width 107 of the sawing blade 130 by about a factor 2, for example. The kerf 100 on a wafer may be wider in an x-direction than in a y-direction. The kerf 100 may be wider when test devices or test structures 140 are located in the kerf 100. For example, the test structures 140 may be process control monitor (pcm) test structures and/or reliability control monitor (rcm) test structures. The pcm/rcm structures may comprise metal and silicon components. After the wafer is completely processed the chips 110, 120 are diced by cutting the wafer along the kerfs. The sawing blade 130 moves along the kerf 100 cutting the wafer and separating the chips 110, 120. While the blade 130 moves along the kerf chipping may occur and cracks may be created. The cracks may propagate towards the chips 110, 120. The seal rings or crack stop barriers 113, 123 are supposed to prevent cracks 150 from propagating into the inner regions 111, 121 of the chips 110, 120. However, not all the cracks 150 may be stopped by the seal rings 113, 123. For example, cracks 150 may spread into the inner regions 111, 121 by bypassing the seal rings 113, 123. The cracks 150 may propagate into the inner regions 111, 121 of the chips 110, 120 by propagating into the substrate 160 where there is no seal ring protection. This is shown in FIG. 2.

Cutting the wafer along the kerf 100 may produce cracks and chipping. Cutting the pcm and/or rcm test structures may produce cracks or chipping. Cracks 150 may also be produced by chipping.

Figure 3:
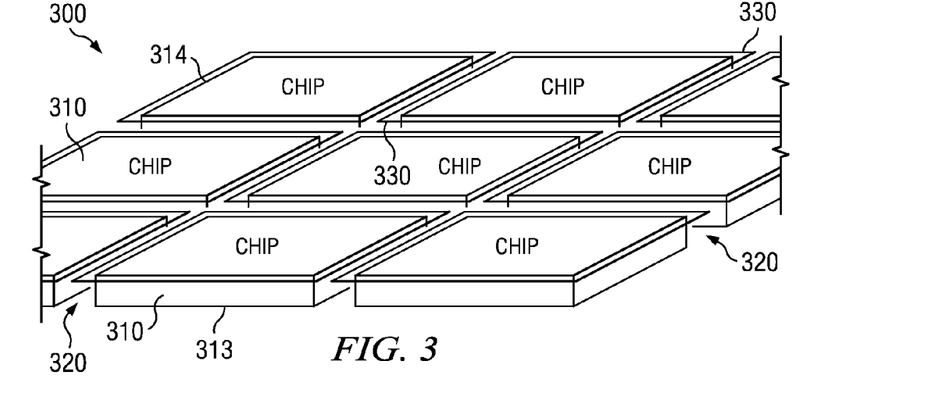
FIG. 3 shows a wafer with an embodiment of a kerf framing.

FIG. 3 shows a portion of a wafer 300. The portion of the wafer 300 comprises a plurality of chips 310 and a plurality of kerfs 320. The kerfs 320 separate the chips 310 from each other. In one embodiment a material structure or kerf framing 330 may be arranged along a short side 314 and/or along a long side 313 of each chip 310. The material structure 330 may be arranged adjacent the long side 313 or the short side 314 of the chips 310 in the kerf 320. The material structure 330 may be arranged next to and may abut the pcm and/or rcm test structures. The material structure 330 may be abutting the long side 313 or the short side 314 of the chips 310. The material structure 330 may be formed directly adjacent or in direct contact with the long side 313 or the short side 314 of the chips 310. The material structure 330 may form a frame in the kerf 320. The material structure 330 may comprise a kerf sealing.

In one embodiment the material structure 330 may be arranged along the entire kerf 320. The material structure 330 may be arranged along the entire kerf 320 in x-direction and/or the entire kerf 320 in y-direction.

The chips 310 may typically comprise seal rings 113, 123 around peripheral regions 113, 123 of the chips 310. The seal ring 113, 123 may prevent cracks 150 from propagating into inner regions 111, 121 of the chips 310. The kerf framing 330 in the kerf 320 may mirror the structure of the seal rings 113, 123 in the chips 310. The kerf framing 330 may comprise the same material or a different material than the seal rings 113, 123 inside the chips 310.

In one embodiment the kerf framing may be manufactured at the same time as the metallization layers of the chips 310 are manufactured. The kerf framing may comprise the same layer stack as the metallization layers and the seal rings of the chips but the metal widths may vary. In one embodiment the width of the kerf framing may be as small as or smaller than the width of the seal rings 113, 123 in order to save chip area. One advantage of such an approach may be that the photomask set which is used to pattern the metallization layers inside the chips may only be changed once in order to define regions where the kerf framing may be manufactured. There may be no additional manufacturing costs to manufacture the kerf framing.

Figure 4:
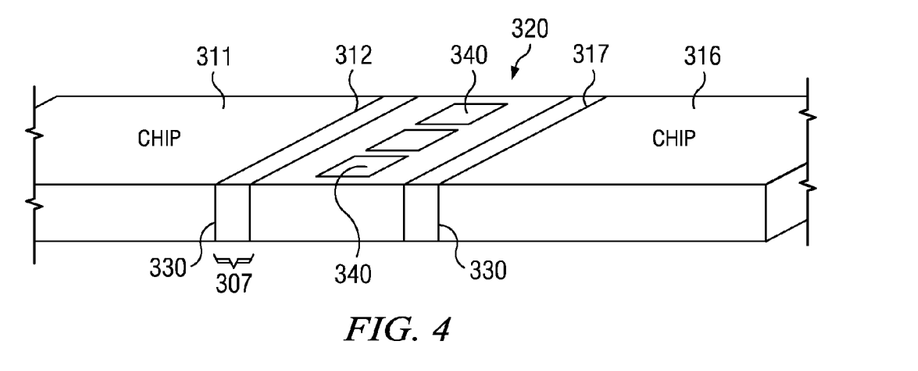
FIG. 4 shows an embodiment of a kerf between two chips.

FIG. 4 shows an embodiment of a kerf 320 between a first chip 311 and a second chip 316. The kerf 320 may comprise test structures 340. For example, the test structures 340 may be pcm or rcm test structures arranged in the middle of the kerf 320. The kerf 320 further comprises a material structure 330. In one embodiment the material structure 330 may be arranged along the pcm/rcm test structures 340, or directly next or adjacent to the pcm/rcm test structures 340. The material structure 330 may comprise a framing material.

In one embodiment the kerf framing 330 is arranged in a peripheral region 307 of the kerf 320. The kerf 320 may comprise a kerf framing 330 next to an outside 312 of the first chip 311 and next to an outside 317 of the second chip 316. The kerf framing 330 may be arranged directly next to or directly adjacent to the outsides 312, 317 of the chips 311, 316. The outsides 312, 317 of the chips 311, 316 may be silicon dioxide or a passivation material such a silicon nitride. The outsides 312, 317 may be a different material than the framing material of the kerf framing 330. The framing material of the kerf framing 330 may comprise a conductive material such as a metal, e.g. aluminum (Al), copper (Cu), or tungsten (W), or a polysilicon. The framing material of the material structure 330 may be a same material as the seal rings 113, 123 in the peripheral regions 112, 122 of the chips 110, 120.

Figure 5A:
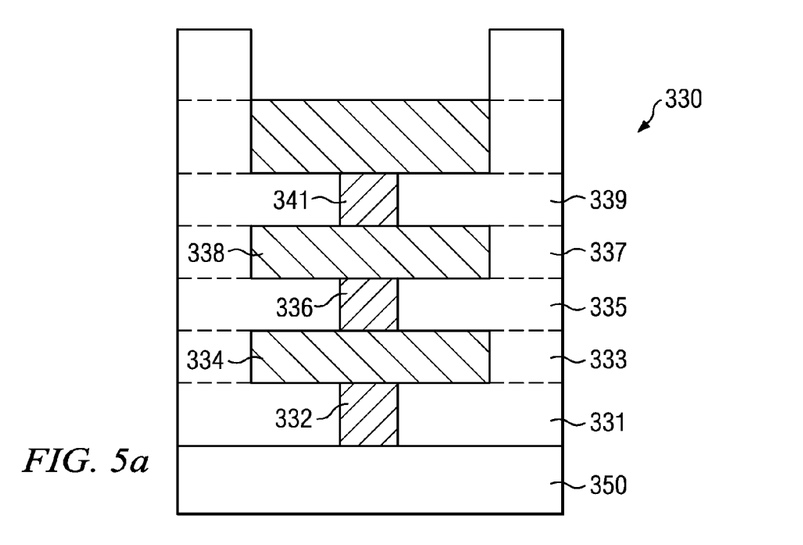
FIG. 5a shows an embodiment of a kerf framing.

FIG. 5a shows a cross-sectional view of an embodiment of a material structure 330 in a kerf 320. The material structure 330 may be made from the deposition of several material layers 331-341. Each material layer 331-341 may comprise an isolation material and a framing material. The isolation material may be silicon dioxide or a low-k dielectric, for example. The framing material may be a conductive material such as a metal, e.g. aluminum (Al), copper (Cu), or tungsten (W), or a polysilicon. Alternatively, the framing material may be a dielectric such as silicon dioxide, silicon nitride, or a high-k dielectric. The framing material of the material structure 330 may be the same as the material used in the test structures 340

The material structure 330 is formed on a wafer or a substrate 350. The substrate 350 may include mono-crystalline silicon, gallium arsenide (GaAs), germanium (Ge), silicon-on-insulator (SOI), or any other substrate material.

A first material layer 331 is formed over the substrate 350 by known methods. The first material layer 331 is patterned to form contact holes or trenches or a combination of contact holes and trenches. The contact holes and/or trenches are filled with the framing material to form plugs and/or lines 332.

In an embodiment, the framing material may be deposited over the first material layer 331 and the plugs/lines 332. The framing material may be sputtered on the first material layer 331 and the plugs/lines 332. The framing material may be patterned and etched to form lines 334. A second material layer 333/335 may be formed over the first material layer 331 and the lines 334, and then planarized. The second material layer 333/335 may be patterned to form contact holes or trenches which are then filled with the framing material to form the plugs and/or lines 336. A framing material may be deposited over the second material layer 333/335 and the plugs/lines 336. The framing material may be patterned and etched to form lines 338. A third material layer 337/339 may be formed over the second material layer 333/335 and the lines 338, and then planarized. The third material layer 337/339 may be patterned to form contact holes or trenches which are then filled with the framing material to form the plugs and/or lines 341. The plugs/lines 332, 336, 341 may comprise tungsten (W) embedded in a Ti/TiN barrier layer. The line 334 may be aluminum (metal 1) and the line 338 may also be aluminum (metal 2). Metal 1 and metal 2 may be surrounded with a Ti/TiN barrier layer.

In another embodiment, the material structure 330 may be formed by a damascene or dual damascene process. A second material layer 333 is deposited and patterned to form trenches. The trenches are filled with the framing material to form lines 334. A third material layer 335 is formed and patterned to create vias and/or trenches which are then filled with the framing material to form the plugs or lines 336. A fourth material layer 337 is deposited and patterned to form trenches and the trenches are then filled with framing material 338. The plugs or lines 336 physically connect the lines 338 of the fourth material layer 337 with the lines 334 of the second material layer 333. The plugs/lines 336, 341 may comprise copper (Cu) embedded in a Ta/TaN barrier layer. The lines 334 may be copper (metal 1) and the lines 338 may also be copper (metal 2). Metal 1 and metal 2 may be surrounded with a Ta/TaN barrier layer.

Figure 6:
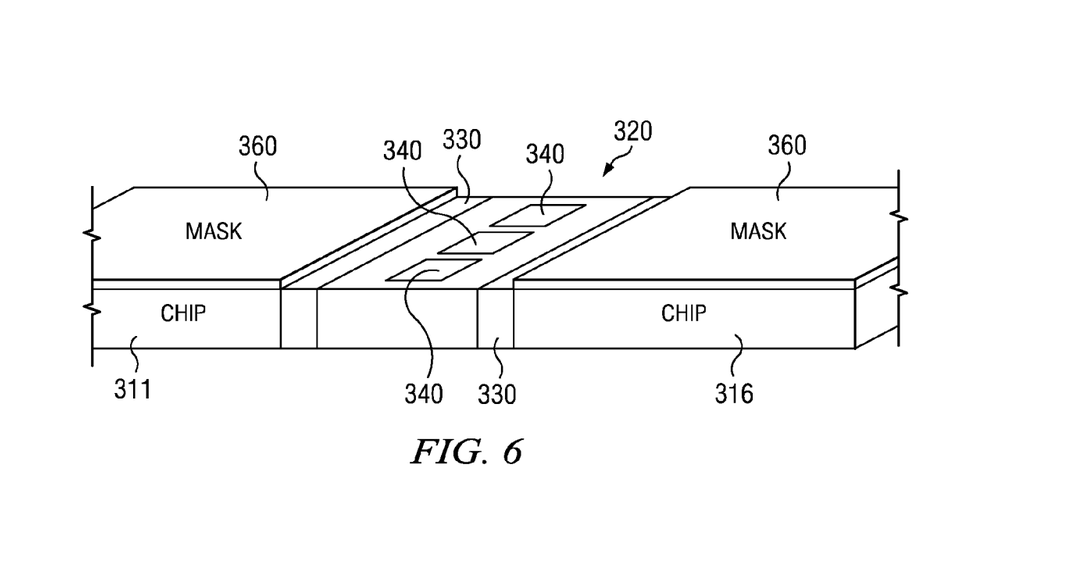
FIG. 6 shows an embodiment of a kerf between two chips where a mask is placed over the two chips.

Advantageously, multiple levels of material layers 331-339 are deposited to form the material structure or framing 330. The material structure 330 may be created by alternating forming material layers 333, 337 having solid material lines 334, 338 and material layers 331, 335 having contacts, plugs or lines 332, 336. In one embodiment the lines of each material layer 331-339 may have the same forms, lengths and/or widths. The material structure 330 may be a stack of framing material as can be seen in FIG. 6.

Figure 5B:
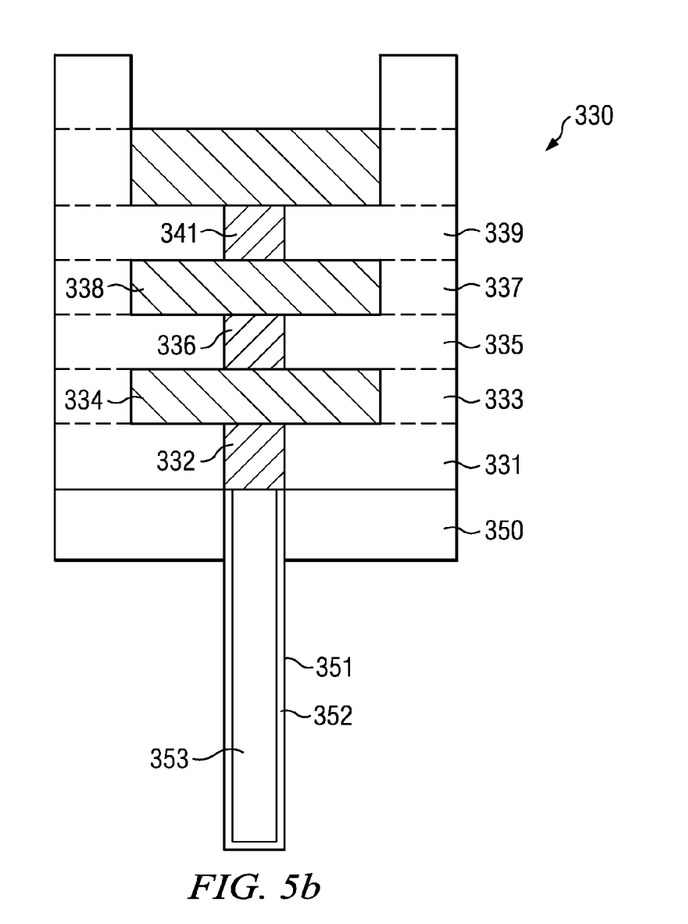
FIG. 5b shows an embodiment of a kerf framing.

FIG. 5b shows a cross-sectional view of an embodiment of a material structure 330 in a kerf 320. A trench 351 may be formed in the substrate 350. The trench 351 may be arranged under the first plug/line 332. The trench 351 may be formed when other features may be processed in the substrate 350. For example, the trench 351 may be formed when capacitors are formed in the substrate 350 of the chips 311, 317. The trench 351 may comprise an isolation layer 352. The isolation layer 352 may be a silicon oxide, silicon nitride or a high-k dielectric. The trench 351 is filled with a fill material 353. The fill material 353 may be a poly-silicon or any other material. The fill material 353 may be removed after the first plug/line 332 is removed. The fill material 353 may be etched with a wet etch chemistry. For example, polysilicon may be etched with about 5% to about 15% tetra-methyl ammonium hydroxid (TMAH) at about 40° C. to about 80° C. The etch rate may be about 100 nm to about 500 nm per minute. TMAH may provide good etch selectivity to silicon oxide or silicon nitride.

The kerf framing 330, the test structure 340 and the chip structure may be manufactured at the same time. The metal materials used for the kerf framing 330 and the metal materials used for the test structure 340 may be the same. In one embodiment, a first isolation layer 331 may be formed on the substrate 350. The first isolation layer 331 is patterned and isolation material is removed in areas where the kerf framing 330 and the test structure 340 will be formed. A metal may be formed in the areas where the isolation material is removed and where the kerf framing 330 and the test structure 340 will be formed, for example. A second isolation layer 333 may be formed on the first isolation layer 331. The second isolation layer 333 is patterned and isolation material is removed in areas where the kerf framing 330 and the test structure 340 will be formed. A metal may be formed in the areas where the kerf framing 330 and the test structure 340 will be formed, for example. The kerf framing 330 and the test structure 340 of the kerf 320 may be built by forming and patterning isolation layers 331-339 one after the other.

FIG. 5a shows a kerf framing 330 having only one row of plugs, contacts or lines (line structure). In one embodiment the kerf framing 330 may be a dual line structure or a multiple line structure. Each line structure of the kerf framing 330 may comprise the same material, width for the lines, width for the plugs, and/or design for each individual line.

Referring now to FIG. 6, a mask 360 is disposed on the chips 311, 316. In one embodiment the mask 360 may be formed on the chips 311, 316 and the kerf 320. The mask 360 may be at least partially removed from the kerf 320 applying known techniques. The mask 360 may be formed on the semiconductor wafer 300 and then removed from the kerfs 320 or from the kerf framing 330 and the test structures 340. In one embodiment the mask 360 may be selectively formed on the chips 311, 316 but not on the kerf 320. The mask 360 may completely cover the chips 311, 316. The mask 360 may not be disposed on the kerf 320. The mask 360 may not be disposed on the kerf framing 330 and the areas of the test structure 340. The mask 360 may be a photoresist. Alternatively, the mask 360 may be a hard mask such as silicon nitride, silicon oxide or silicon oxynitride. The hard mask may comprise carbon.

In one embodiment the mask 360 may be selectively formed with an electro less plating process (eLess). The mask 360 may be formed over exposed metal lines or pads of the chips 311, 316 but not over the kerf framing 330 and the areas of the test structures 340. An example for an eLess plating integration scheme is described in U.S. patent application Ser. No. 12/836,151, which is incorporated herein by reference for all purposes. The mask 360 may be a noble metal such as gold or palladium. In a subsequent etch process the kerf framing 330 and the test structures 340 may be removed while the metal lines or pads of the chips 311, 316 may not be removed since they are protected by the noble metal. In one embodiment the noble metal may not be removed in a later process step but may remain on the metal lines or pads.

An etch process may be applied to the semiconductor wafer 300. The etch process may be a wet chemical etch. The wet chemical etch may be selective regarding the material structure 330, the test structure 340, the isolation material 325 and the mask material 360. The wet chemical etch may remove the material structure 330 but not the mask material 360 and the isolation material 325. The wet chemical etch may only remove the framing material from the material structure 330 and the test structure 340. In one embodiment the wet chemical etch may remove metals but may not remove photoresists, hardmasks and isolation materials. In one embodiment the wet chemical etch may remove metals with a high etch rate and may remove photoresists, hardmasks and/or isolation materials with no or with only a low etch rate. The wet chemical etch may be an isotropic metal etch with a high selectivity to photoresists, hardmasks and isolation materials.

Table 1 shows a list of metals to be etched, the respective etchant and the etch rate for these etchants on non-metal materials. For example, aluminum may be etched with diluted HF which has a very high etch rate on aluminum and a low etch rate on the isolation materials and the hard mask. Copper may be etched with a diluted phosphoric peroxide mixture. The diluted phosphoric peroxide mixture may not etch the isolation materials and/or the mask materials.

TABLE 1

| Metal to be etched | Etchant | Etchrate SiO$_x$ and SiN |
|---|---|---|
| Aluminum (Al) | diluted hydrogen fluoride (HF) | low etch rate |
|  | phosphoric, nitric mixture | no etch rate |
| Titan (Ti) | diluted HF | low etch rate |
|  | diluted ammonia peroxide mixture | no etch rate |
| Titan Nitride (TiN) | diluted ammonia peroxide mixture | no etch rate |
| Tungsten (W) | diluted ammonia peroxide mixture | no etch rate |
| Titan Tungsten (TiW) | diluted ammonia peroxide mixture | no etch rate |
| Copper (Cu) | diluted phosphoric peroxide mixture | no etch rate |

In one particular example, 0.1% diluted HF may etch about 300 nm aluminum per minute and only 0.4 nm silicon oxide per minute. Diluted HF may be applied at a temperature of about 20° C. Diluted ammonia peroxide mixture (ammonia-peroxide-water=1:8:25) may etch about 30 nm/min of Ti/TiN at a temperature of about 40° C. and may etch about 200 nm/min of tungsten. Diluted ammonia peroxide mixture may also be applied at a temperature of about 35° C. to about 70° C. Diluted phosphoric peroxide mixture (phosphoric acid 2%, peroxide 0.8%, water) may etch about 600 nm/min of copper.

Etching the material structure 330 may include a single etch step or a plurality of etch steps. The etch steps may be applied sequentially. For example, a first etch chemistry may be applied to an upper part of the material structure 330 and a second etch chemistry may be applied to a lower part of the material structure 330.

In one example, a diluted HF etch chemistry is applied to the upper aluminum layers in the material structure 330 and diluted ammonia peroxide mixture is applied to the lower tungsten arrangement in the material structure 330. In another example, diluted phosphoric peroxide mixture and diluted ammonia peroxide mixture are applied sequentially and alternately for copper and its tantalum nitride barrier for each layer and diluted ammonia peroxide mixture is applied to tungsten.

Figure 7:
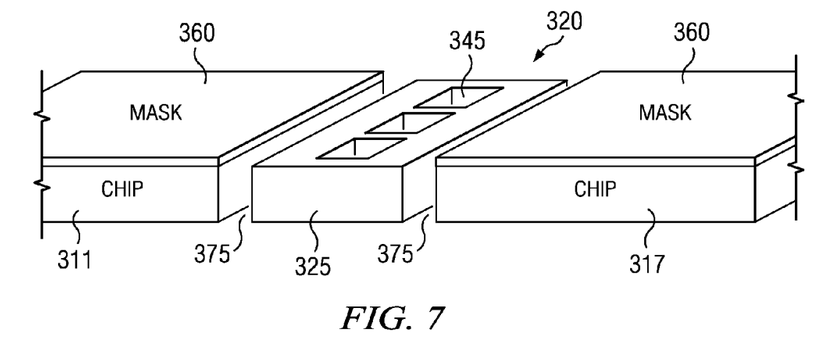
FIG. 7 shows an embodiment of a kerf after removal of the kerf framing.

In one embodiment the kerf framing 330 may comprise two aluminum metallization layers. The contact plug 332 may comprise a Ti/TiN barrier and a tungsten plug. Line 334 may comprise a Ti/TiN barrier, a first aluminum (metal 1), and a Ti/TiN anti reflective coating (ARC). The plug 336 may comprise a Ti/TiN liner and a tungsten plug. Line 338 may be a Ti/TiN barrier, a second aluminum (metal 2), and Ti/TiN ARC. Such a layer stack may be etched with a diluted ammonia peroxide mixture and then rinsed. Next, the layer stack may be etched with a diluted HF and then rinsed again. In a next step, the layer stack is again etched with a diluted ammonia peroxide mixture and then rinsed. In yet a further step, the layer stack may be etched with a diluted HF and then rinsed. And in a final step, the layer stack may be etched with a diluted ammonia peroxide mixture The materials for the test structures 340 may comprise the same materials for each layer as the kerf framing 330 does. Accordingly, the applied wet etch chemistry may not only remove the material of the kerf framing 330 for a specific layer but also the material for the test structure 340 in this layer. For example, the kerf framing 330 may comprise aluminum or copper in the upper layers and tungsten in the lowest layer and the test structure 340 may comprise aluminum or copper in the upper layers and tungsten in the lowest layer. Accordingly, applying a first etch chemistry in the upper layer removes the material of the kerf framing 330 and the test structure 340 in these upper layers at the same time and applying a second etch chemistry in the lowest layer removes the material of kerf framing 330 and the test structure 340 in this lowest layer at the same time. After the individual wet chemical etch or the series of wet chemical etches has been applied openings 345 and trenches 375 may remain in the kerf 320. This is shown in FIG. 7.

After applying the etch process the kerf framing 330 may become trenches 375. The kerf 320 may have trenches 375 along the sides of the chips 311, 316 or along the test structures 340. The kerf 320 may have trenches 375 in the peripheral regions of the kerf 320. The trenches 375 may be etched down to the substrate 350 or to one of the lower isolation layers. All or substantially all of the material of the kerf framing 330 may be removed.

After applying the etch process the test structures 340 may comprise vias, holes or trenches 345. The vias, holes or trenches 345 may be arranged in the middle of the kerf 320. The vias, holes or trenches 345 may be etched down to the substrate 350 or to one of the lower isolation layers. All or substantially all the framing material in the test structures 340 may be removed.

The framing material of the kerf framing 330 and the framing material of the testing structure 340 may comprise the same materials and may be removed at the same time.

In one embodiment the material of the kerf framing 330 may be different than the material of the testing structure 340. For example, the material of the testing structure 340 may comprise a metal, which is not used in the kerf framing 330. In one embodiment only the material of the kerf framing 330 may be removed.

Figure 8:
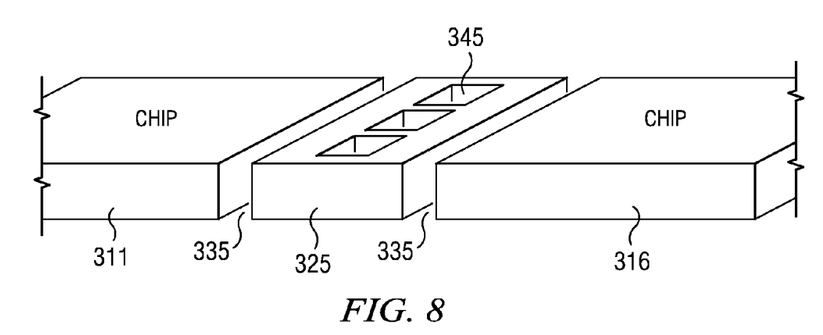
FIG. 8 shows an embodiment of a kerf after removal of the mask.

Next, as shown in FIG. 8, the mask 360 on the chips 311, 316 may be removed. The masks 360 may be removed with an etch process. The photoresist may be removed with a wet solvent such as N-Methylpyrolidon (NMP) or Dimethylformamid (DMF). Alternatively, the photoresist may be removed with an $O_2$ ash process and clean in a wet chemical process. The hardmask may be removed with a dry etch step such as a plasma etch or an ash step. The plasma etch may be an isotropic plasma etch such as an reactive ion etching (RIE) using gas chemistries such as carbon tetra fluoride ($CF_4$), sulfur hexafluoride ($SF_6$) or fluoroform ($CHF_3$). The ash step may be performed using oxygen ($O_2$). The removal of the mask 360 may be selective towards silicon or the remaining structures of the kerf 320 and the outside or encapsulating materials of the chips 311, 316.

Figure 9:
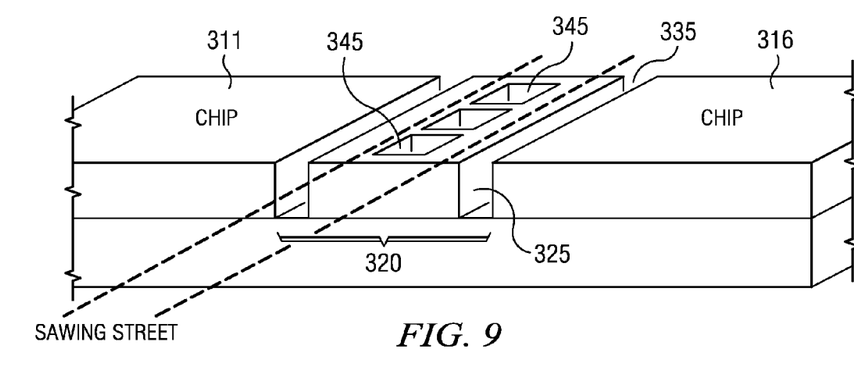
FIG. 9 shows a sawing street along an embodiment of the kerf.

After the mask 360 is removed from the chips 311, 316, the chips 311, 316 may be separated by a sawing process. Embodiments of the present invention may not create chipping or cracks. Embodiments of the present invention may create only limited chipping or cracks. The vias, holes or trenches 345 may not create chipping or cracks when the sawing blade moves along the kerf 320. The vias, holes or trenches 345 may create limited chipping or cracks when the wafer is cut along a sawing street using a sawing blade 130. The vias, holes or trenches 345 may create less chipping or cracks than test structure 340 when cut. The blade 130 may cut only through isolation material 325 and not through isolation material 325 and metals, for example.

The trenches 335 may stop any cracks created by cutting the kerf 320. Cracks created by the sawing process may not be able to cross the trenches 335 towards the chips 311, 316. The trenches 335 in the kerf 320 and the seal rings 113, 123 of the chips 311, 316 may provide a double crack stop barrier. The trenches 335 of the kerf 320 and the seal rings 113, 123 of the chips 311, 316 may provide a more effective crack stop barrier than just the seal rings 113, 123 around the chips 311, 316. The trenches 335 of the kerf 320 may provide a more effective crack stop barrier than the seal rings 113, 123 around the chips 311, 316.

Embodiments of the present invention may have the advantage that chipping may not be produced or may be produced to a limited extend. Embodiments of the present invention may have the advantage that cracks may not be produced or may be produced to a limited extend. Embodiments of the present invention may have the advantage that cracks may be produced by the sawing process may not propagate towards the chips because of the trenches in the periphery of the kerf. Cracks may be stopped by the trenches at the periphery of the kerf. Cracks may be stopped by the discontinuity in the isolation material of the kerfs. Embodiments of the present invention may lower the risk of cracks propagating into the inner region of the chips.

Embodiments of the present invention may have the advantage that all or substantially all metal in the kerf is removed. Therefore, the event of chipping may be substantially reduced. Even if chipping occurs cracks may not propagate towards the chips because of the trenches in the peripheral regions of the kerfs next. The sawing process may produce no or less cracks. The trenches left after removing the kerf framing in the kerf may prevent propagation of cracks into the chips.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A method for manufacturing a chip comprising:
   forming a material structure in a kerf adjacent the chip supported by a wafer, wherein the material structure is arranged directly adjacent a long side and a short side of the chip;
   forming a test structure in the kerf;

etching the material structure and the test structure in the kerf; and dicing the wafer.

2. The method according to claim 1, wherein etching the material structure and the test structure in the kerf comprises etching the material structure and the test structure at the same time.

3. The method according to claim 1, wherein etching the material structure and the test structure comprises forming a mask over the chip and etching the material structure and the test structure in the kerf.

4. The method according to claim 3, wherein the mask comprises a photoresist, silicon nitride, silicon oxide, silicon oxynitride or carbon.

5. A method for manufacturing semiconductor chips, the method comprising:
   forming a metal structure in a scribe line abutting a side of each semiconductor chip supported by a semiconductor wafer;
   forming a metal test structure in the scribe line;
   forming a mask on each semiconductor chip;
   etching the metal structure and the metal test structure, wherein etching comprises applying at least one of a diluted HF, a diluted ammonia peroxide mixture or a diluted phosphoric peroxide mixture; and
   cutting the semiconductor wafer in the scribe line thereby singulating the semiconductor chips.

6. The method according to claim 5, wherein etching the metal structure and the metal test structure comprises sequentially etching the metal structure and the metal test structure.

7. The method according to claim 5, wherein the mask comprises a photoresist, silicon nitride, silicon oxide, silicon oxynitride or carbon.

8. A semiconductor wafer comprising:
   a plurality of chips, the chips having metal lines or pads comprising a metal;
   a noble metal directly disposed on the metal lines or pads;
   a plurality of kerfs, the kerfs separating the chips from each other;
   a kerf framing disposed in the plurality of kerfs, the kerf framing directly adjacent each side of the plurality of chips; and
   test structures disposed in the plurality of kerfs,
   wherein the kerf framing and the test structures comprise the metal.

9. The semiconductor wafer according to claim 8, wherein the test structure comprises a process control monitor or a reliability control monitor.

10. The semiconductor wafer according to claim 8, wherein the plurality of chips comprises logic chips or memory chips.

11. A method for manufacturing a chip comprising:
    forming a material structure in a kerf adjacent the chip supported by a wafer;
    forming a mask over the chip;
    etching the material structure in the kerf, wherein etching comprises applying a series of etch chemistries; and
    dicing the wafer.

12. The method according to claim 11, wherein the etch chemistries are selected from the group consisting of diluted hydrogen fluoride (HF), diluted ammonia peroxide mixture and diluted phosphoric peroxide mixture.

13. A method for manufacturing semiconductor chips, the method comprising:
    forming a metal structure in a scribe line abutting a side of each semiconductor chip supported by a semiconductor wafer;
    forming a metal test structure in the scribe line;
    forming a mask on each semiconductor chip;
    etching the metal structure and the metal test structure, wherein etching the metal structure and the metal test structure comprises sequentially etching the metal structure and the metal test structure, and wherein sequentially etching comprises first applying a diluted HF or a diluted phosphoric peroxide mixture and then applying a diluted ammonia peroxide mixture; and
    cutting the semiconductor wafer in the scribe line thereby singulating the semiconductor chip.

14. The method according to claim 13, wherein the mask comprises a photoresist, silicon nitride, silicon oxide, silicon oxynitride or carbon.

15. A method for manufacturing a chip comprising:
    forming a material structure in a kerf adjacent the chip supported by a wafer;
    selectively e-less plating exposed metal lines or pads with a metal on the chip;
    selectively removing the material structure in the kerf; and
    dicing the wafer.

16. The method according to claim 15, wherein the metal comprises gold or palladium.

17. The method according to claim 15, further comprising removing the metal after selectively removing the material structure in the kerf.

18. The semiconductor wafer according to claim 8, wherein the noble metal comprises gold.

19. The semiconductor wafer according to claim 8, wherein the noble metal comprises palladium.

20. A method for manufacturing a chip comprising:
    forming a material structure in a kerf adjacent the chip supported by a wafer;
    forming a test structure in the kerf;
    etching the material structure and the test structure in the kerf, wherein etching the material structure and the test structure comprises forming a mask over the chip and etching the material structure and the test structure in the kerf; and
    dicing the wafer.

21. The method according to claim 20, wherein the mask comprises a photoresist, silicon nitride, silicon oxide, silicon oxynitride or carbon.

* * * * *